(12) United States Patent
Torii et al.

(10) Patent No.: US 11,228,173 B2
(45) Date of Patent: Jan. 18, 2022

(54) LIMITER CIRCUIT

(71) Applicant: Mitsubishi Electric Corporation, Tokyo (JP)

(72) Inventors: Takuma Torii, Tokyo (JP); Masatake Hangai, Tokyo (JP); Koji Yamanaka, Tokyo (JP); Kazuhiro Nishida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/014,337

(22) Filed: Sep. 8, 2020

(65) Prior Publication Data
US 2020/0403401 A1      Dec. 24, 2020

Related U.S. Application Data

(63) Continuation of application No. PCT/JP2018/017432, filed on May 1, 2018.

(51) Int. Cl.
*H02H 9/02* (2006.01)
*H02H 9/04* (2006.01)
*H03H 7/01* (2006.01)
*H02H 9/00* (2006.01)

(52) U.S. Cl.
CPC ............. *H02H 9/025* (2013.01); *H02H 9/02* (2013.01); *H02H 9/021* (2013.01); *H02H 9/045* (2013.01); *H02H 9/005* (2013.01); *H02H 9/04* (2013.01); *H03H 7/01* (2013.01); *H03H 7/17* (2013.01)

(58) Field of Classification Search
CPC .......... H02H 9/02; H02H 9/025; H02H 9/021; H02H 9/045; H02H 9/04; H02H 9/00; H02H 9/005; H03H 7/01; H03H 7/17; H03H 17/00

USPC ............................................ 361/56, 117–119
See application file for complete search history.

(56) References Cited

U.S. PATENT DOCUMENTS

| | | | |
|---|---|---|---|
| 2007/0262816 A1* | 11/2007 | Kashiwa | H03F 3/191 330/136 |
| 2008/0238569 A1* | 10/2008 | Matsuo | H03H 7/40 333/32 |
| 2010/0225376 A1 | 9/2010 | Tsukahara | |

FOREIGN PATENT DOCUMENTS

| | | |
|---|---|---|
| JP | 2007-6433 A | 1/2007 |
| JP | 2010-206472 A | 9/2010 |
| JP | 2012-195676 A | 10/2012 |

OTHER PUBLICATIONS

Japanese Notice of Reasons for Refusal for Japanese Application No. 2020-516990, dated Dec. 22, 2020, with an English translation.

* cited by examiner

*Primary Examiner* — Danny Nguyen
(74) *Attorney, Agent, or Firm* — Birch, Stewart, Kolasch & Birch, LLP

(57) ABSTRACT

A switch element is arranged between an input terminal and an output terminal. A signal from the input terminal is distributed by a capacitative element and supplied to the cathode side of a diode. An inductor is connected to the cathode side of the diode, and a smoothing circuit including a capacitative element and a resistor is connected to the anode side. The switch element has a control terminal connected to the anode of the diode, and turns off a path between the input terminal and the output terminal when a voltage is applied to the control terminal.

5 Claims, 3 Drawing Sheets

LIMITER CIRCUIT

CROSS-REFERENCE TO RELATED APPLICATION

This application is a Continuation of PCT International Application No. PCT/JP2018/017432 filed on May 1, 2018, which is hereby expressly incorporated by reference into the present application.

TECHNICAL FIELD

The present invention relates to a limiter circuit for reducing the power of a high frequency signal when the power exceeds a predetermined value.

BACKGROUND ART

There are limiter circuits for suppressing the power of a high frequency signal to be equal to or less than a predetermined value when the power of the high frequency signal supplied to an input terminal exceeds the predetermined value. As a conventional limiter circuit, for example, the limiter circuit described in Patent Literature 1 distributes a signal supplied to an input terminal, and one of the distributed signals is detected by a detection diode, this detected signal is measured in a reception power measuring unit. The other one of the distributed signals is supplied to an attenuator, and the signal attenuated by the attenuator is output. Here, the reception power measuring unit detects the level of the input signal, and an attenuator control unit outputs a control signal to the attenuator depending on the detected level of the signal. The attenuator control unit outputs a control signal so that the attenuation amount of the attenuator is large when the signal level is high, thereby performing the operation as the limiter circuit.

CITATION LIST

Patent Literatures

Patent Literature 1: JP 2012-195676 A

SUMMARY OF INVENTION

Technical Problem

However, the above-mentioned conventional limiter circuits have a disadvantage that an attenuator for attenuating an input signal is required as well as components such as an attenuator control unit and a reception power measuring unit for controlling the attenuation amount of the attenuator, and thus the limiter circuit has a large number of parts, thereby making it difficult to miniaturize.

The present invention has been made to solve the disadvantage as the above, and an object of the present invention is to provide a limiter circuit that enables reduction of the number of parts and miniaturization.

Solution to Problem

A limiter circuit according to the present invention includes: an input terminal to which a high frequency signal is supplied; an output terminal to output the high frequency signal supplied to the input terminal; a distributor to distribute a portion of the high frequency signal; a diode to turn on or off depending on a level and a cycle of the distributed signal, a cathode of the diode connected with the distributor; an inductor to ground a current flowing from the diode when the diode is in an on state; a smoothing circuit to smooth a voltage generated at an anode of the diode, the smoothing circuit connected between the anode of the diode and a ground; and a switch element to turn off a path between the input terminal and the output terminal when a voltage is applied to a control terminal, the switch element connected between the input terminal and the output terminal and having the control terminal connected to the anode of the diode.

Advantageous Effects of Invention

In a limiter circuit according to the present invention, the cathode of a diode is connected with a distributor for distributing a high frequency signal and an inductor for grounding the current flowing from the diode. The anode of the diode is connected with a smoothing circuit and a control terminal of a switch element. The switch element turns off the high frequency signal between the input terminal and the output terminal when a voltage is applied to the control terminal. As a result, the limiter circuit can be configured without increasing the number of parts.

DESCRIPTION OF EMBODIMENTS

To describe the present invention further in detail, embodiments for carrying out the present invention will be described below with reference to the accompanying drawings.

First Embodiment

Figure 1:
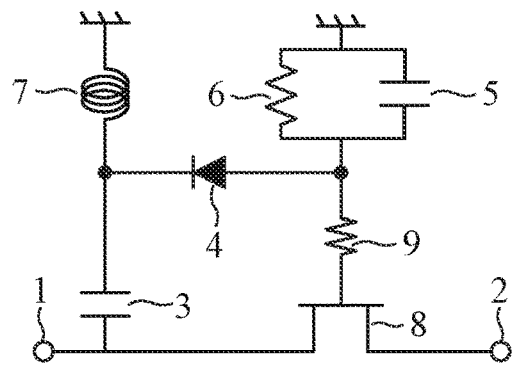
FIG. 1 is a configuration diagram illustrating a limiter circuit according to a first embodiment of the present invention.

FIG. 1 is a configuration diagram illustrating a limiter circuit according to the present embodiment. The limiter circuit illustrated in FIG. 1 includes an input terminal 1, an output terminal 2, a capacitative element 3, a diode 4, a capacitative element 5, a resistor 6, an inductor 7, a switch element 8, and a bias resistor 9.

The input terminal 1 is a terminal to which a high frequency signal is supplied and is connected to the source terminal of the switch element 8. Note that the high frequency signal has a frequency used in wireless communication. The output terminal 2 is a terminal for outputting the high frequency signal input from the input terminal 1, and is connected to the drain terminal of the switch element 8. The capacitive element 3 forms a distributor for distributing a portion of the high frequency signal input from the input terminal 1, and has one end connected to the input terminal 1 and the source terminal of the switch element 8 and the other end connected to one end of the inductor 7 and the cathode of the diode 4. The diode 4 includes, for example, a field effect transistor, and the anode of the diode 4 is connected with one end of the capacitive element 5, one end of the resistor 6, and one end of the bias resistor 9. The capacitive element 5 and the resistor 6 form a smoothing circuit for smoothing the voltage generated at the anode of the diode 4, and the other ends of the capacitive element 5 and the resistor 6 are grounded. The inductor 7 is a DC return inductor for grounding the current flowing from the diode 4 when the diode 4 is in an on state, and the other end of the inductor 7 is grounded. The switch element 8 includes, for example, a field effect transistor, and the gate terminal of the switch element 8 is connected with the other end of the bias resistor 9, and is turned on or off by a control voltage applied to the gate terminal. The bias resistor 9 increases the input impedance seen from the gate terminal of the switch element 8. Meanwhile, the inductor 7 has a role of causing the current flowing from the diode 4 to flow to the ground, and matching so that the voltage detected by the capacitive element 3 is efficiently transmitted to the cathode of the diode 4. It is also assumed in the first embodiment that the switch element 8 is a transistor having normally-on characteristics such as gallium nitride (GaN).

Note that the capacitive element 3, the diode 4, the capacitive element 5, the resistor 6, the inductor 7, and the bias resistor 9 may be formed on the same substrate together with the switch element 8.

Next, the operation of the limiter circuit according to the first embodiment will be described.

A high frequency signal is input from the input terminal 1, and one of the distributed high frequency signals is transmitted to the cathode of the diode 4 via the capacitive element 3. The other one of the distributed high frequency signals is applied to the source terminal of the switch element 8.

First, the operation at low input power will be described.

At low input power, the voltage amplitude $v_K$ of the signal transmitted to the cathode of the diode 4 via the capacitive element 3 is sufficiently small, and the diode 4 is turned off. At this point, no current flows through the diode 4. The gate terminal of the switch element 8 is connected to the ground via the bias resistor 9 and the resistor 6. Therefore, 0 V is applied to the gate terminal of the switch element 8. When the switch element 8 includes a normally-on transistor such as GaN, the switch element 8 is turned on. When the switch element 8 is turned on, the drain-source junction of the switch element 8 enters a through state, and thus the signal transmitted to the source terminal is connected to the drain terminal. Therefore, at low input power, the signal transmitted from the input terminal 1 reaches the output terminal 2 via the source terminal and the drain terminal and is output.

Next, the operation at high input power will be described.

At high input power, the diode 4 is turned off when a positive voltage amplitude is generated at the cathode of the diode 4, and is turned on when a negative voltage amplitude is generated.

When the diode 4 is turned on, a current flows from the diode 4 to the inductor 7. At this point, a voltage drop of a forward voltage $V_f$ occurs in the diode 4. A voltage of $v_A = v_K + V_f$ is generated at the anode of the diode 4.

When $v_K$ has positive and negative amplitudes cyclically, the diode 4 is turned on depending on the cycle of the negative amplitude. Since the forward voltage $V_f$ is a constant value, the larger the negative amplitude of $v_K$ is, the more $v_A$ shifts to a negative voltage. The voltage $v_A$ at the anode is applied to the gate terminal of the switch element 8 via the bias resistor 9.

When $v_K$ has a positive amplitude, the diode 4 is turned off however if the cycle is sufficiently smaller than a time constant $\tau$ determined by the capacitive element 5 and the resistor 6, a charge stored in the capacitive element 5 is not discharged, and a voltage drop occurs in the capacitive element 5. Therefore, even when $v_K$ has a positive voltage amplitude, $v_A$ has a negative potential without being 0 V.

Therefore, during large signal operation, $v_A$ shifts from 0 V to a negative potential. Therefore, the switch element 8 shifts from the ON state to the OFF state, and no signal is transmitted from the input terminal 1 to the output terminal 2 at high input power, and thus operation as a limiter circuit is implemented.

Figure 2:
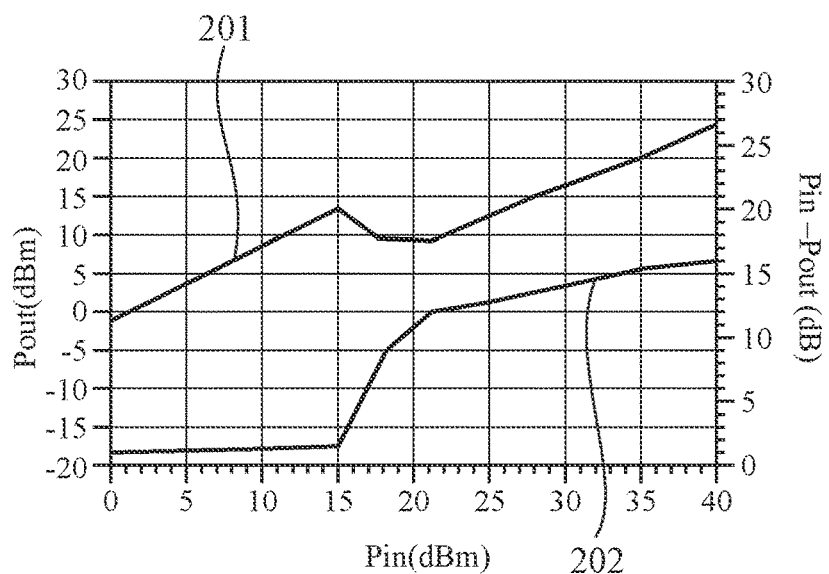
FIG. 2 is an explanatory graph illustrating a relationship between input power and output power of the limiter circuit according to the first embodiment of the present invention.

FIG. 2 is an explanatory graph illustrating a relationship between input power and output power. In FIG. 2, Pin represents input power (dBm), Pout represents output power (dBm), and Pin-Pout represents a difference (dB) between input power and output power. A characteristic 201 indicates the relationship of Pout with Pin, and a characteristic 202 indicates Pin-Pout. From FIG. 2, operation as the limiter can be confirmed around an input power of 20 dBm. Note that the level of input power that indicates the operation as the limiter can be adjusted by the capacitance value of the capacitive element 3, and an exemplary calculation is illustrated in FIG. 2.

As described above, the limiter circuit of the first embodiment includes: the input terminal to which a high frequency signal is supplied; the output terminal for outputting the high frequency signal supplied to the input terminal; the distributor for distributing a portion of the high frequency signal; the diode for turning on or off depending on the level and the cycle of the distributed signal, the cathode of the diode connected with the distributor; the inductor for grounding a current flowing from the diode when the diode is in an on state; the smoothing circuit for smoothing a voltage generated at the anode of the diode, the smoothing circuit connected between the anode of the diode and a ground; and the switch element for turning off a path between the input terminal and the output terminal when a voltage is applied to a control terminal, the switch element connected between the input terminal and the output terminal and having the control terminal connected to the anode of the diode. Therefore, the limiter circuit can be configured without increasing the number of parts, thereby enabling miniaturization of the limiter circuit.

Second Embodiment

Figure 3:
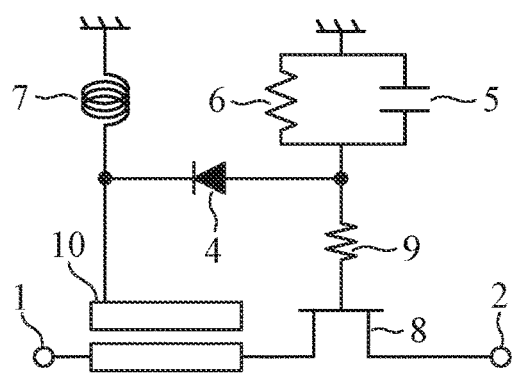
FIG. 3 is a configuration diagram illustrating a limiter circuit according to a second embodiment of the present invention.

In a second embodiment, the distributor includes a directional coupler. In FIG. 3, a limiter circuit of the second embodiment will be illustrated.

In FIG. 3, a directional coupler 10 is a unidirectional coupler that forms a distributor for distributing a high frequency signal input from an input terminal 1. One of the distributed signals is supplied to the cathode of a diode 4 and one end of an inductor 7, and the other signal is supplied to the source terminal of a switch element 8. Other components are similar to those of the first embodiment illustrated in FIG. 1, and thus the same symbols are provided to corresponding parts, and description thereof will be omitted. The operation is also similar to that of the first embodiment except that the high frequency signal is distributed by the directional coupler 10.

As described above, according to the limiter circuit of the second embodiment, the distributor is configured by the directional coupler, and thus low loss characteristics can be obtained in addition to the effects of the first embodiment.

Third Embodiment

Figure 4:
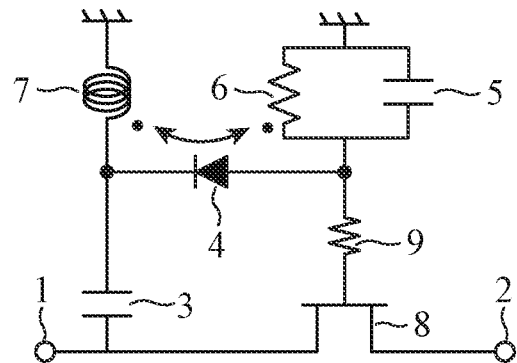
FIG. 4 is a configuration diagram illustrating a limiter circuit according to a third embodiment of the present invention.

In a third embodiment, a resistor included in a smoothing circuit and an inductor have a relationship of electromagnetic field coupling. In FIG. 4, a limiter circuit of the third embodiment will be illustrated.

In the limiter circuit of the third embodiment, a capacitative element 3, a diode 4, a capacitative element 5, a resistor 6, an inductor 7, and a bias resistor 9 are formed on the same substrate together with a switch element 8. The inductor 7 has a relationship of electromagnetic field coupling with the resistor 6. Components other than the above are similar to those of the first embodiment illustrated in FIG. 1, and thus the same symbols are provided to corresponding parts, and description thereof will be omitted.

Figure 5:
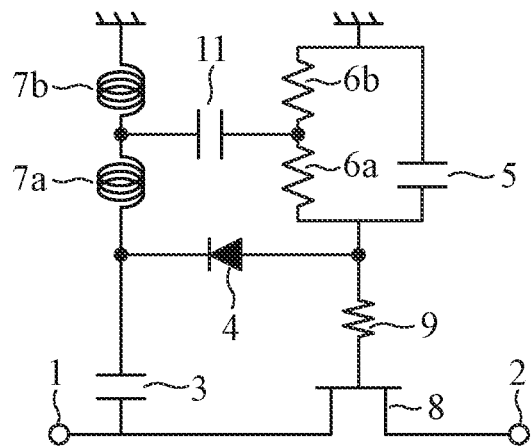
FIG. 5 is an equivalent circuit schematic of the limiter circuit according to the third embodiment of the present invention.

In the limiter circuit of the third embodiment, a coupling capacitance is formed between the inductor 7 and the resistor 6. The coupling capacitance can be regarded as an equivalent capacitance in a frequency band in which the impedance of this coupling capacitance is not negligible. FIG. 5 is a diagram illustrating an equivalent circuit of the circuit of FIG. 4 at a frequency in which the impedance of the coupling capacitance is not negligible, in this example, a frequency higher than the set frequency of the limiter circuit. In FIG. 5, inductors 7a and 7b are parts of the inductor 7, resistors 6a and 6b are parts of the resistor 6, and a coupling capacitance 11 is that between the inductor 7 and the resistor 6.

Figure 6:
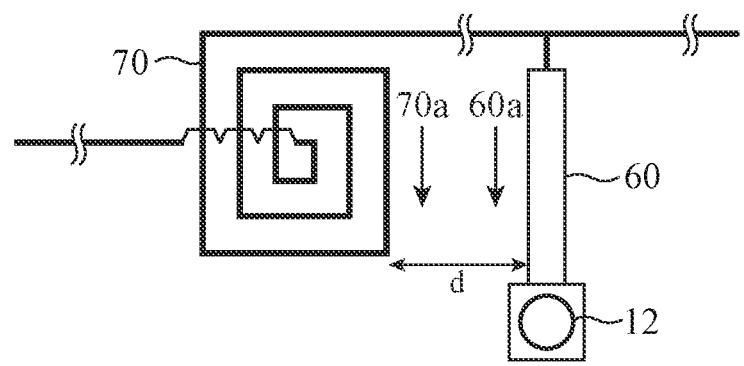
FIG. 6 is a configuration diagram illustrating a forming example of the limiter circuit according to the third embodiment of the present invention.
Figure 7:
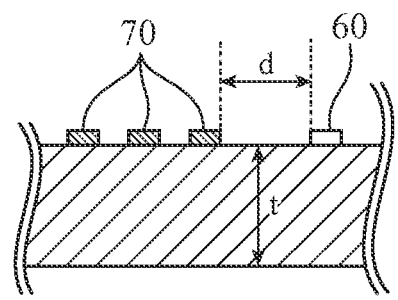
FIG. 7 is a cross-sectional view of the main part of the limiter circuit according to the third embodiment of the present invention.

FIG. 6 is a diagram illustrating a forming example of the limiter circuit according to the third embodiment. FIG. 7 is a cross-sectional view of the main part of the limiter circuit. In FIGS. 6 and 7, a spiral inductor 70 corresponds to the inductor 7, and a resistor 60 corresponds to the resistor 6. Note that, in FIGS. 6 and 7, components other than the spiral inductor 70 and the resistor 60 are omitted. The resistor 60 is connected to the ground via a via 12. In FIG. 6, arrow 70a indicates a current flowing through the spiral inductor 70 and the direction thereof, and arrow 60a indicates a current flowing through the resistor 60 and the direction thereof.

As illustrated by arrows 70a and 60a, a current flowing through the spiral inductor 70 and a current flowing through the resistor 60 are directed in the same direction, and the spiral inductor 70 and the resistor 60 are arranged so that the distance d therebetween is smaller than the thickness t of the semiconductor substrate on which the spiral inductor 70 and the resistor 60 are formed.

In FIG. 5, the capacitative element 3, the inductor 7a, the coupling capacitance 11, and the resistor 6b form an LRC serial resonance circuit. Since the coupling capacitance 11 can be regarded as an equivalent capacitance at a frequency higher than the set frequency of the limiter circuit, the resonance frequency of this serial resonance circuit is higher than the operating frequency of the limiter circuit. At the resonance frequency, the impedance seen from the input terminal 1 toward the capacitative element 3 is low and indicates high reflection characteristics. Therefore, a signal around the resonance frequency does not reach the output terminal 2, and the limiter circuit according to the third embodiment has a band cutoff characteristic.

Therefore, in the limiter circuit of the third embodiment, it is possible to obtain a configuration having a band cutoff characteristic without increasing the number of parts.

Note that although the case where the resistor 6 and the inductor 7 are in the relationship of electromagnetic field coupling has been described in the above example, similar effects can be obtained even in a case where the capacitative element 5 and the inductor 7 are in a relationship of electromagnetic field coupling. In this case, application can be made likewise by adopting a configuration in which the resistor 60 of FIGS. 6 and 7 corresponds to the capacitative element 5.

As described above, according to the limiter circuit of the third embodiment, the smoothing circuit includes the resistor and the capacitative element, a current flowing through the resistance and a current flowing through the inductor flow in the same direction, and the distance between the resistance and the inductor is smaller than the thickness of the substrate. Therefore, the resistance and the inductor have the relationship of electromagnetic field coupling, and a band cutoff characteristic can be obtained by selecting the distance between the resistance and the inductor, in addition to the effects of the first embodiment.

Note that the present invention may include a flexible combination of the embodiments, a modification of any component of the embodiments, or an omission of any component in the embodiments within the scope of the present invention.

INDUSTRIAL APPLICABILITY

As described above, a limiter circuit according to the present invention relates to a configuration that reduces the power of a high frequency signal when the high frequency signal exceeds a predetermined value, and thus is suitable for miniaturization by suppressing an increase in the number of parts of the limiter circuit in which elements are arranged on a substrate.

REFERENCE SIGNS LIST

1: input terminal,
2: output terminal,
3: capacitative element,
4: diode,
5: capacitative element,
6, 60: resistor,
7: inductor,
8: switch element,
9: bias resistor,
10: directional coupler,
11: coupling capacitance,
12: via,
70: spiral inductor

The invention claimed is:
1. A limiter circuit comprising:
an input terminal to which a high frequency signal is supplied;
an output terminal to output the high frequency signal supplied to the input terminal;
a distributor to distribute a portion of the high frequency signal;
a diode to turn on or off depending on a level and a cycle of the distributed signal, a cathode of the diode connected with the distributor;

an inductor to ground a current flowing from the diode when the diode is in an on state;

a smoothing circuit to smooth a voltage generated at an anode of the diode, the smoothing circuit connected between the anode of the diode and a ground; and a switch element to turn off a path between the input terminal and the output terminal when a voltage is applied to a control terminal, the switch element connected between the input terminal and the output terminal and having the control terminal connected to the anode of the diode.

2. The limiter circuit according to claim 1, wherein the distributor comprises a capacitative element having one end connected to the input terminal and another end connected to the cathode of the diode.

3. The limiter circuit according to claim 1, wherein the distributor comprises a directional coupler.

4. The limiter circuit according to claim 2, wherein the switch element and the diode each comprise a field effect transistor, and the capacitative element, the inductor, and the smoothing circuit are arranged on a same substrate together with the switch element and the diode.

5. The limiter circuit according to claim 4, wherein the smoothing circuit comprises a resistor and a capacitative element, a current flowing through the resistor and a current flowing through the inductor flow in a same direction, and a distance between the resistor and the inductor is smaller than a thickness of the substrate.

\* \* \* \* \*